United States Patent
Lee et al.

(10) Patent No.: US 8,995,199 B2
(45) Date of Patent: Mar. 31, 2015

(54) FLASH MULTIPLE-PASS WRITE WITH ACCURATE FIRST-PASS WRITE

(71) Applicant: SK hynix memory solutions inc., San Jose, CA (US)

(72) Inventors: Meng-Kun Lee, Cupertino, CA (US); Yingquan Wu, Palo Alto, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

(21) Appl. No.: 14/478,884

(22) Filed: Sep. 5, 2014

(65) Prior Publication Data

US 2014/0376314 A1    Dec. 25, 2014

Related U.S. Application Data

(63) Continuation of application No. 14/169,826, filed on Jan. 31, 2014, now Pat. No. 8,854,893, which is a continuation of application No. 13/422,774, filed on Mar. 16, 2012, now Pat. No. 8,681,563.

(60) Provisional application No. 61/471,633, filed on Apr. 4, 2011.

(51) Int. Cl.
| | |
|---|---|
| *G11C 11/34* | (2006.01) |
| *G11C 16/10* | (2006.01) |
| *G11C 16/04* | (2006.01) |
| *G11C 16/34* | (2006.01) |
| *G11C 16/12* | (2006.01) |
| *G11C 11/56* | (2006.01) |

(52) U.S. Cl.
CPC ............... *G11C 16/10* (2013.01); *G11C 16/34* (2013.01); *G11C 16/04* (2013.01); *G11C 16/12* (2013.01); *G11C 11/56* (2013.01)
USPC ............. 365/185.19; 365/185.14; 365/185.28

(58) Field of Classification Search
CPC .... G11C 16/10; G11C 11/5628; G11C 16/12; G11C 16/0483; G11C 16/3454
USPC ........................... 365/185.19, 185.14, 185.28
See application file for complete search history.

(56) References Cited

U.S. PATENT DOCUMENTS 5,726,934 A * 3/1998 Tran et al. ............... 365/185.2

* cited by examiner

*Primary Examiner* — Jason Lappas
(74) *Attorney, Agent, or Firm* — Van Pelt, Yi & James LLP

(57) ABSTRACT

An instruction to write to a location in the Flash memory is received. It is determining if the Flash memory exposes a level placement setting associated with defining what voltage range corresponds to what level. In the event it is determined that the Flash memory exposes a level placement setting, an accurate coarse write is performed on the location, including by configuring the level placement setting to be a first value, and after the accurate coarse write is performed on the location, a fine write is performed on the location, including by configuring the level placement setting to be a second value, in response to receiving the instruction.

20 Claims, 8 Drawing Sheets

US 8,995,199 B2

FLASH MULTIPLE-PASS WRITE WITH ACCURATE FIRST-PASS WRITE

CROSS REFERENCE TO OTHER APPLICATIONS

This application is a continuation of co-pending U.S. patent application Ser. No. 14/169,826, entitled FLASH MULTIPLE-PASS WRITE WITH ACCURATE FIRST-PASS WRITE filed Jan. 31, 2014 which is incorporated herein by reference for all purposes, which is a continuation of U.S. patent application Ser. No. 13/422,774, entitled FLASH MULTIPLE-PASS WRITE WITH ACCURATE FIRST-PASS WRITE filed Mar. 16, 2012 now U.S. Pat. No. 8,681,563 which is incorporated herein by reference for all purposes, which claims priority to U.S. Provisional Patent Application No. 61/471,633 entitled DATA RECOVERY FROM UNFINISHED MULTIPLE-PASS WRITE DURING POWER INTERRUPTION filed Apr. 4, 2011 which is incorporated herein by reference for all purposes.

BACKGROUND OF THE INVENTION

Multiple-pass write to Flash memory is a technique in which a write is divided into multiple passes or stages. The first pass is sometimes referred to as a coarse write, with later writes referred to as fine writes. Multiple-pass writes are popular because it mitigates interference at one write line caused by writing to an adjacent write line in Flash memory. It would be desirable if improved techniques could be developed for multiple-pass writes, for example which reduce bus usage and/or overhead memory associated with existing techniques (e.g., overhead in the Flash memory itself or in a separate random access memory (RAM)), and/or which permit recovery of the data in the event power is lost between a coarse write and a fine write.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
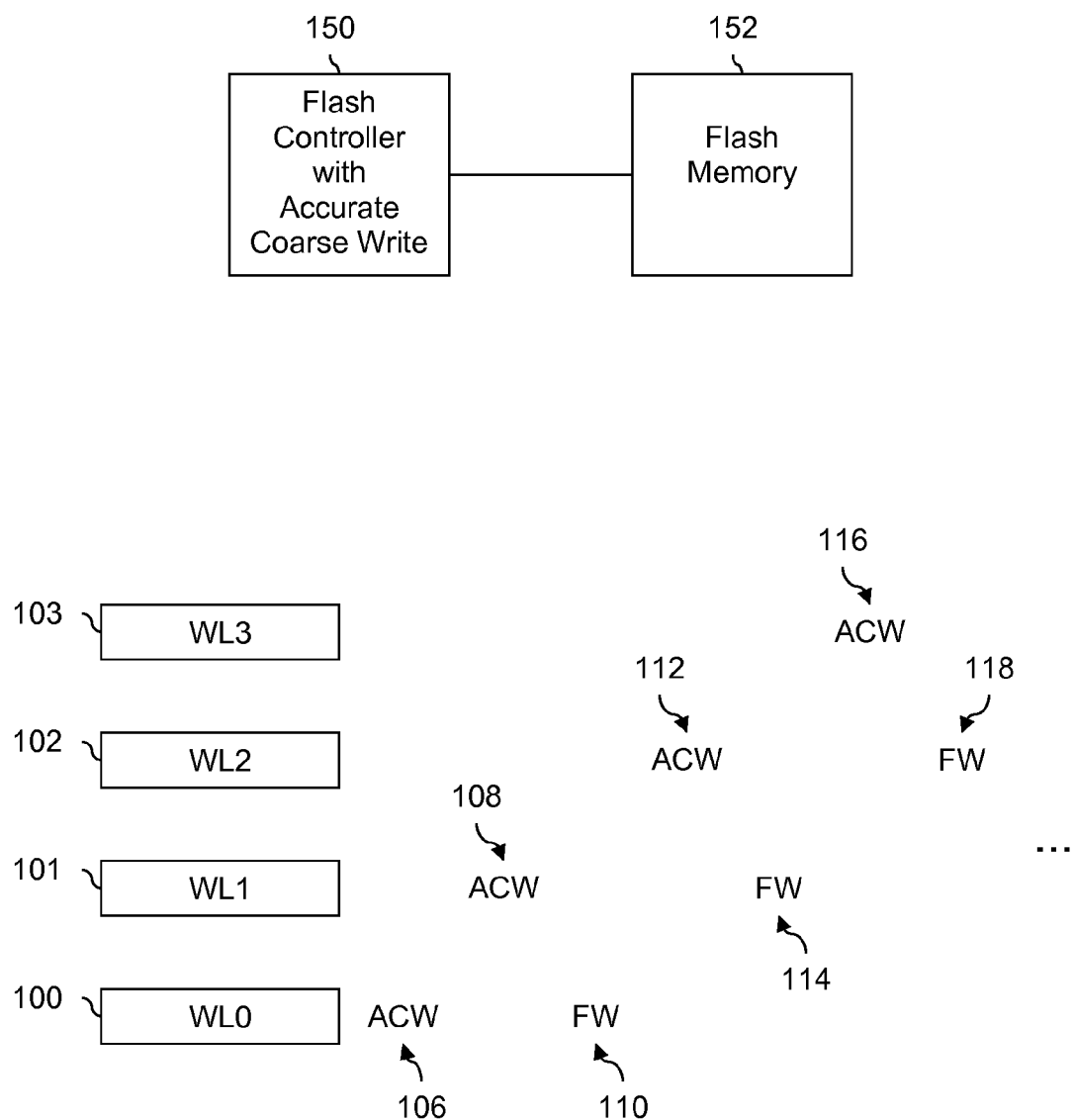
FIG. 1 is a diagram showing an embodiment of a Flash storage system and a multiple-pass write sequence associated with the Flash storage system.

FIG. 1 is a diagram showing an embodiment of a Flash storage system and a multiple-pass write sequence associated with the Flash storage system. In the example shown, Flash controller 150 writes data to and reads data from Flash memory 152. Flash controller 150 is configured to perform multiple-pass write, specifically (at least in this example) a 2-pass write where an accurate coarse write is performed prior to a fine write. For example, write lines 100-103 are included in Flash memory 152. An accurate coarse write is performed on write line 100 at 106, followed by an accurate coarse write (108) to write line 101. Next, a fine write (110) is performed on write line 100 and an accurate coarse write is performed at 112 on write line 102. At 114, a fine write is performed on write line 101, followed by an accurate coarse write at 116 to write line 103. This is followed by a fine write at 118 to write line 102.

Writing to write lines 100-103 as shown in this exemplary sequence mitigates interference between write lines due to the writing process. For example, writing to write line 100 causes some additional charge to be added to one or more voltages stored in write line 101. In Flash memory, data is stored as voltage levels, so an increase in voltage level (e.g., due to a write to an adjacent location) may cause an error (e.g., if the noise is enough to push the stored voltage into a next voltage range and an error correction code does not fix the error).

Flash controller 150 is configured to perform an accurate coarse write. An accurate coarse write is a coarse write in a multi-pass write in which the correct value is knowingly and/or deliberately written (e.g., so that if read back, the value would be interpreted as the correct value). For example, in a 2-bit Flash storage scenario where the levels are L0-L3 (e.g., corresponding to 00, 01, 10, 11, or some other mapping), and where the level L0 corresponds to voltages below a threshold $v_{01}$, an accurate coarse write (which is part of a multi-pass write which is writing the level L0 to some write line) would program a voltage that is less than $v_{01}$. An accurate coarse write may include adjusting or otherwise setting a configuration setting associated with Flash storage to some setting or value for the accurate coarse write (e.g., where that configuration setting has some other value for a corresponding fine write). In contrast, some other systems which do not perform an accurate coarse write do not necessarily know and/or care what value is being written during a coarse write. In some embodiments, an accurate coarse write does not necessarily guarantee that the correct value would be read back as the correct value all of the time or absolutely, but rather attempts to write or program the correct value to a sufficient or satisfactory degree (e.g., for some statistical outliers, the stored value would not be interpreted as the correct value if read back but the outliers are acceptably infrequent or unlikely).

One advantage to an accurate coarse write is that a Flash system is able to recover even if there is an interruption between a coarse write to a given write line and the subsequent fine write to that write line. For example, if there is a power loss between the coarse write at 108 and before the fine write at 110, the values stored in write lines 100 and 101 are able to be read back as their correct values since coarse writes 106 and 108 are accurate coarse writes. Another advantage is a possible reduction in overhead storage requirements. Some other systems which do not perform accurate coarse writes use overhead memory to store a correct value, for example on a separate random access memory (RAM) semiconductor device. In one exemplary system, the correct value is first stored in the RAM (e.g., at some point prior to a fine write), and is then read back from the RAM with the read-back value being used during the fine write. This requires additional components (e.g., the RAM) in order to store the data for multiple NAND device programs. The technique described herein does not prevent usage of a RAM to speed up the fine write without reading the accurate coarse write from the NAND. Some other systems store a correct value in the Flash memory itself (e.g., in single-level cells (SLC) of Flash memory 152) which reduces usable capacity. A Flash controller configured to perform accurate coarse writes may not necessarily require such overhead storage.

In some embodiments, Flash controller 150 and/or Flash memory 152 are implemented in hardware, for example as a semiconductor device such as an application-specific integrated circuit (ASIC), a field-programmable gate array (FPGA), or an embedded microprocessor such as an Advanced RISC Machine (ARM) embedded core.

Although this example and other examples described herein may refer to a coarse write or to a 2-pass write, the techniques described herein may be for multi-pass writes with any number of passes, such as a 3-pass write system.

Figure 2:
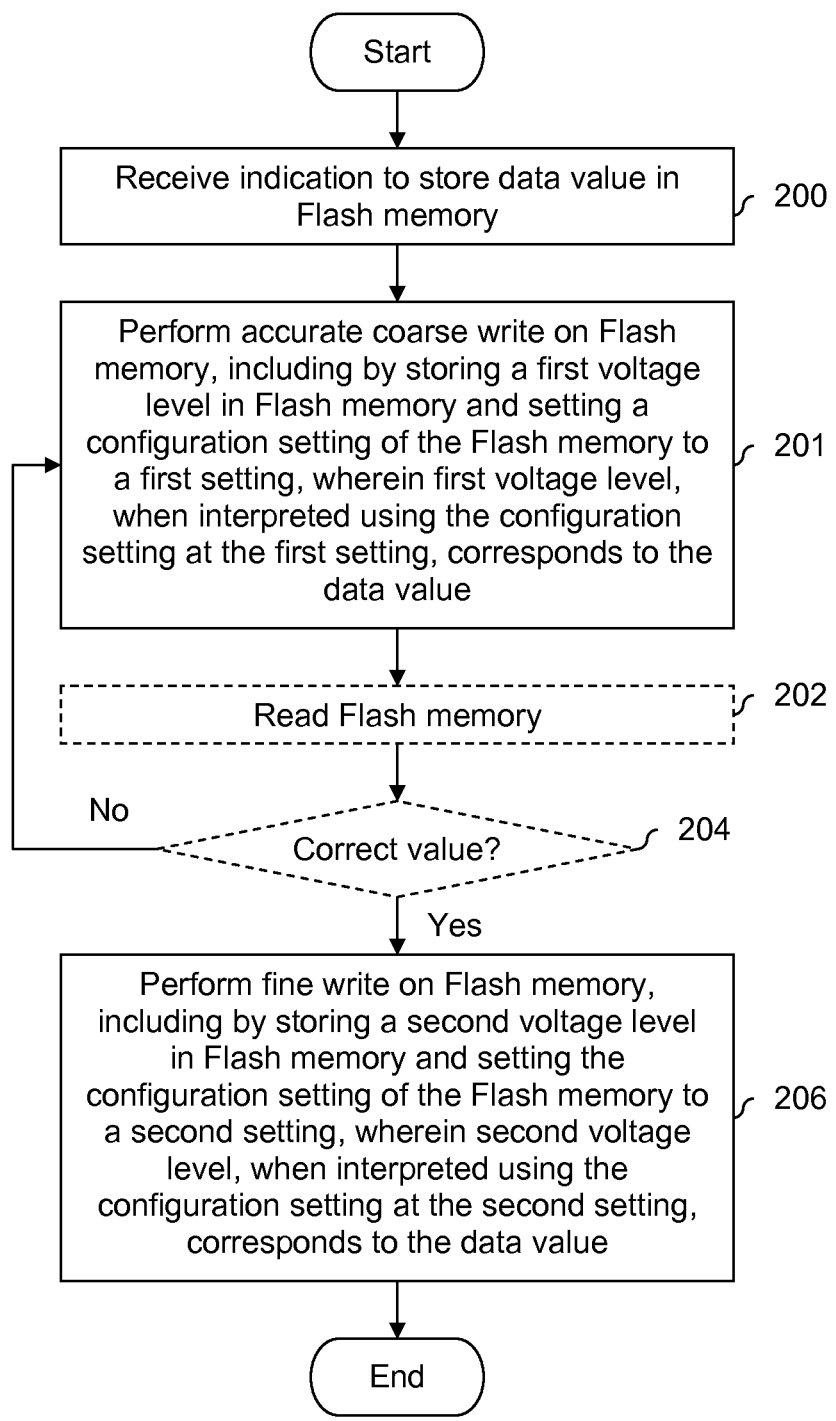
FIG. 2 is a flowchart illustrating an embodiment of a multiple-pass write process with an accurate coarse write.

FIG. 2 is a flowchart illustrating an embodiment of a multiple-pass write process with an accurate coarse write. In some embodiments, the process is performed by a Flash controller, such as Flash controller 150 in FIG. 1.

At 200, an indication to store a data value in Flash memory is received. For example, a driver or other upper level entity may instruct a Flash controller to store data in Flash memory, and the system is configured to perform writes in multiple passes in order to mitigate interference. At 201, an accurate coarse write is performed on Flash memory, including by storing a first voltage level in the Flash memory and setting a configuration setting of the Flash memory to a first setting, wherein the first voltage level, when interpreted using the configuration setting at the first setting, corresponds to the data value. For example, if the data value to be stored corresponds to level L1 from a set of possible levels L0-L3 (i.e., a 2-bit system), after the accurate coarse write at 201 but before the fine write at 206, if read back, the level stored in write line of interest would be interpreted as L1 (e.g., based on the configuration set at 201). Some examples of Flash memory configurations which may be set at 201 include ones related to level placement, program pulses, and/or ramp windows.

Steps 202 and 204 are optional and are not performed in some embodiments. At 202, Flash memory is read. It is determined at 204 if it is a correct value (e.g., if the level L1 was intended to be written at 201, was L1 returned at 202?). If so, at 206, a fine write is performed on Flash memory, including by storing a second voltage level in Flash memory and setting the configuration setting of the Flash memory to a second setting, wherein the second voltage level, when interpreted using the configuration setting at the second setting, corresponds to the data value. For example, if the configuration setting is associated with level placement, the second voltage level stored at 206 may be greater than the first voltage level, but the setting of the level placement(s) is such that the second voltage level stored corresponds to the correct level (e.g., L1 in the example above). If not, an accurate coarse write is performed again at 201.

In one example of performing a read at 202 and determining if it is a correct value at 204, in FIG. 1, write line 102 in FIG. 1 is read back after the accurate coarse write at 112. In some embodiments where a read and check is performed, at most one accurate coarse write is unverified at a time. This may minimize an amount of memory required to store correct values for unverified write lines (e.g., for the comparison at 204 between the correct value and what was read back). If so performed, repeating a coarse write at 201 (e.g., after it is determined at 204 that the value read back at 202 is not the correct value) is performed in a variety of ways, for example depending upon how a particular accurate coarse write is implemented and/or what controls or interfaces are exposed by a particular Flash memory device. In some embodiment, if the stored voltage is lower than a voltage range corresponding to the correct value, one or more program pulses is performed to bring the stored voltage up to a voltage that corresponds to the correct data value. In some cases, if the stored voltage level is too high and it is possible to adjust the level placement, repeating an accurate coarse write at 201 includes adjusting a level placement (e.g., without performing any additional program pulses) so that the stored value falls within the new level placements corresponding to the correct value.

As shown in FIG. 1, fine writes may be interleaved with accurate coarse writes. For clarity, the steps in the example process shown here are to the same write line (e.g., the accurate coarse write at 201 and the fine write at 206 are to the same write line). Conceptually, multiple versions of the example process shown may be operating simultaneously, where each process is associated with a particular write line. For example, there might be one process running for write line 100 in FIG. 1, another process running for write line 101 in FIG. 1, and so on.

As part of performing an accurate coarse write, one or more configuration settings associated with Flash memory may be adjusted. The following figures describe some example configuration settings and exemplary values for those configuration settings during an accurate coarse write and fine write.

Figure 3:
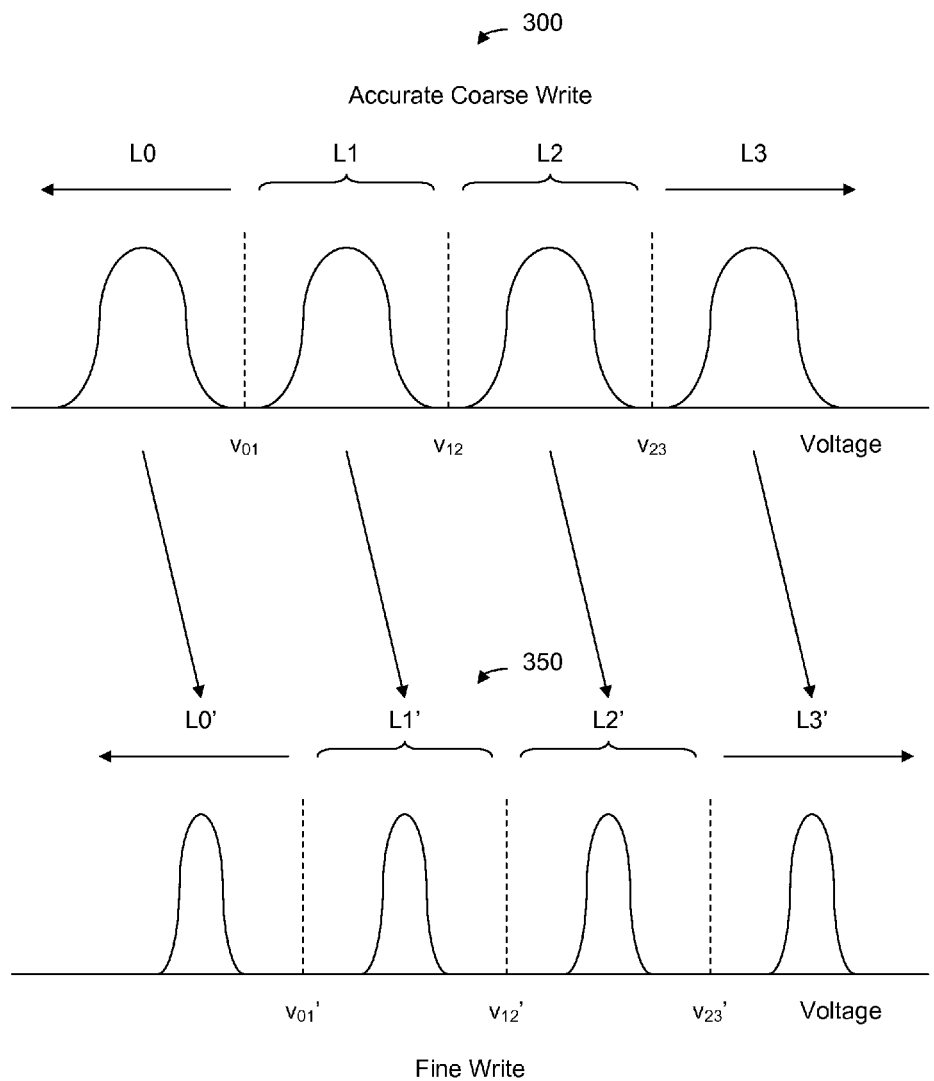
FIG. 3 is a diagram showing an embodiment of voltage distributions for an accurate coarse write and a fine write where level placement is adjusted.

FIG. 3 is a diagram showing an embodiment of voltage distributions for an accurate coarse write and a fine write where level placement is adjusted. Level placement refers to the voltage ranges which define each level. In diagram 300, for example, the levels L0-L3 associated with an accurate coarse write are defined by the thresholds $v_{01}$, $v_{12}$, and $v_{23}$ and in diagram 350 the levels L0'-L3' associated with a fine write are defined by the thresholds $v_{01}'$, $v_{12}'$, and $v_{23}'$. Each of the levels may correspond to a particular data value, for example levels L0 and L0' correspond to a data value of 00, levels L1 and L1' correspond to a data value of 01, levels L2 and L2' correspond to a data value of 11, and levels L3 and L3' correspond to a data value of 10. In this particular example, $v_{01} \neq v_{01}'$, $v_{12} \neq v_{12}'$, and $v_{23} \neq v_{23}'$, and more specifically, $v_{01} < v_{01}'$, $v_{12} < v_{12}'$, and $v_{23} < v_{23}'$.

Diagrams 300 and 350 also show example voltage distributions for each of the levels for both the accurate coarse write and the fine write. In this example, the means of the voltage distributions associated with the accurate coarse write are less than the means of their corresponding fine write voltage distributions in 350. For example, the mean of the distribution for L0 is less than the mean of the distribution for L0'. The widths of the distributions for the accurate coarse write are also greater than the distributions of their fine write counterparts (e.g., the standard deviation (or variance) of the distribution associated with L0 is greater than the standard deviation (or variance) of the distribution associated with L0').

Achieving a particular voltage distribution (e.g., having a desired mean, a desired width, a desired fall-off/shape, etc.) during an accurate coarse write or fine write depends upon the particular Flash memory implementation. Different Flash memory devices will expose different interfaces, controls, and/or configuration settings which can be manipulated to achieve a desired voltage distribution.

Although not shown in this example, the distribution for accurate coarse write 300 may have a narrower distribution than some other systems' coarse writes. For example, to ensure the accuracy of an accurate coarse write, it may also be necessary to control the precision of a coarse write and since other systems do not care about what value would be read back, those systems care about neither accuracy nor precision. In some embodiments, the width of a distribution associated with an accurate coarse write is substantially the same as that of a distribution associated with a fine write. For example, as more bits are stored per cell, the distance between two thresholds (e.g., between $v_{01}$ and $v_{12}$) may decrease and to ensure an accurate coarse write is read back as a correct value to a sufficient or acceptable degree, the width of a distribution for an accurate coarse write may be reduced in order to achieve this objective.

The level placements and distributions shown are merely exemplary and some other embodiments employ other level placements and/or voltage distributions. In some embodiments, a spacing between thresholds (e.g., between $v_{01}$ and $v_{12}$ or between $v_{01}'$ and $v_{12}'$) varies between an accurate coarse write and a fine write (e.g., $(v_{12}-v_{01}) \neq (v_{12}'-v_{01}')$). In some embodiments, one or more level placements remain the same for an accurate coarse write and a fine write (e.g., threshold $v_{01}$ remains the same but thresholds $v_{12}$ and $v_{23}$ change).

In some applications, adjusting a level placement between an accurate coarse write and a fine write (one example of which is shown herein) is attractive because it makes achieving an accurate coarse write easier and/or increases a degree or likelihood of a value written by an accurate coarse write being interpreted as a correct value if read back.

In some embodiments, a storage system uses an error correction code or error detecting code on the stored data and the techniques described herein may be used in combination with various coding techniques. In some embodiments, an accurate coarse write does not necessarily guarantee that a value will be interpreted as a correct value all of the time, for example, even after any error correction decoding or error detection decoding.

Figure 4:
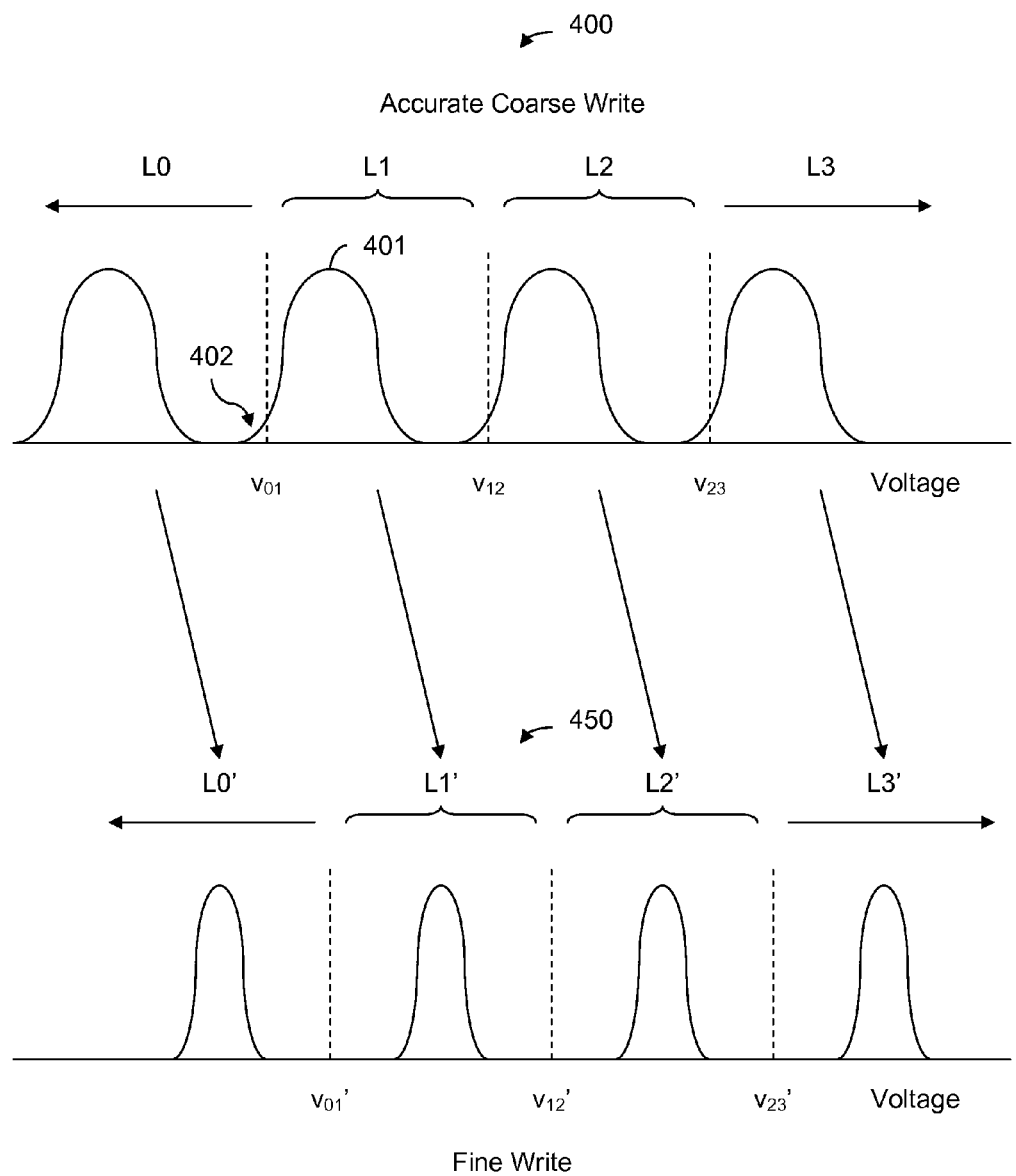
FIG. 4 is a diagram showing an embodiment of voltage distributions for an accurate coarse write and a fine write where a correct data value is not necessarily guaranteed.

FIG. 4 is a diagram showing an embodiment of voltage distributions for an accurate coarse write and a fine write where a correct data value is not necessarily guaranteed. In the example shown, some portions of some of the voltage distributions in diagram 400 do not lie within the proper voltage ranges. For example, portion 402 of distribution 401 is below the threshold $v_{01}$ and therefore those voltages (which occur relatively infrequently) would incorrectly be interpreted as level L0 instead of level L1. However, the frequency or degree to which this occurs may be acceptable or satisfactory (e.g., in light of desired system performance, an expected environment of operation, mean time between failures, etc.). As shown in this figure, in some embodiments an accurate coarse write does not necessarily guarantee that a data value or level written by an accurate coarse write will always be interpreted as the correct data value or correct level if read back.

Figure 5:
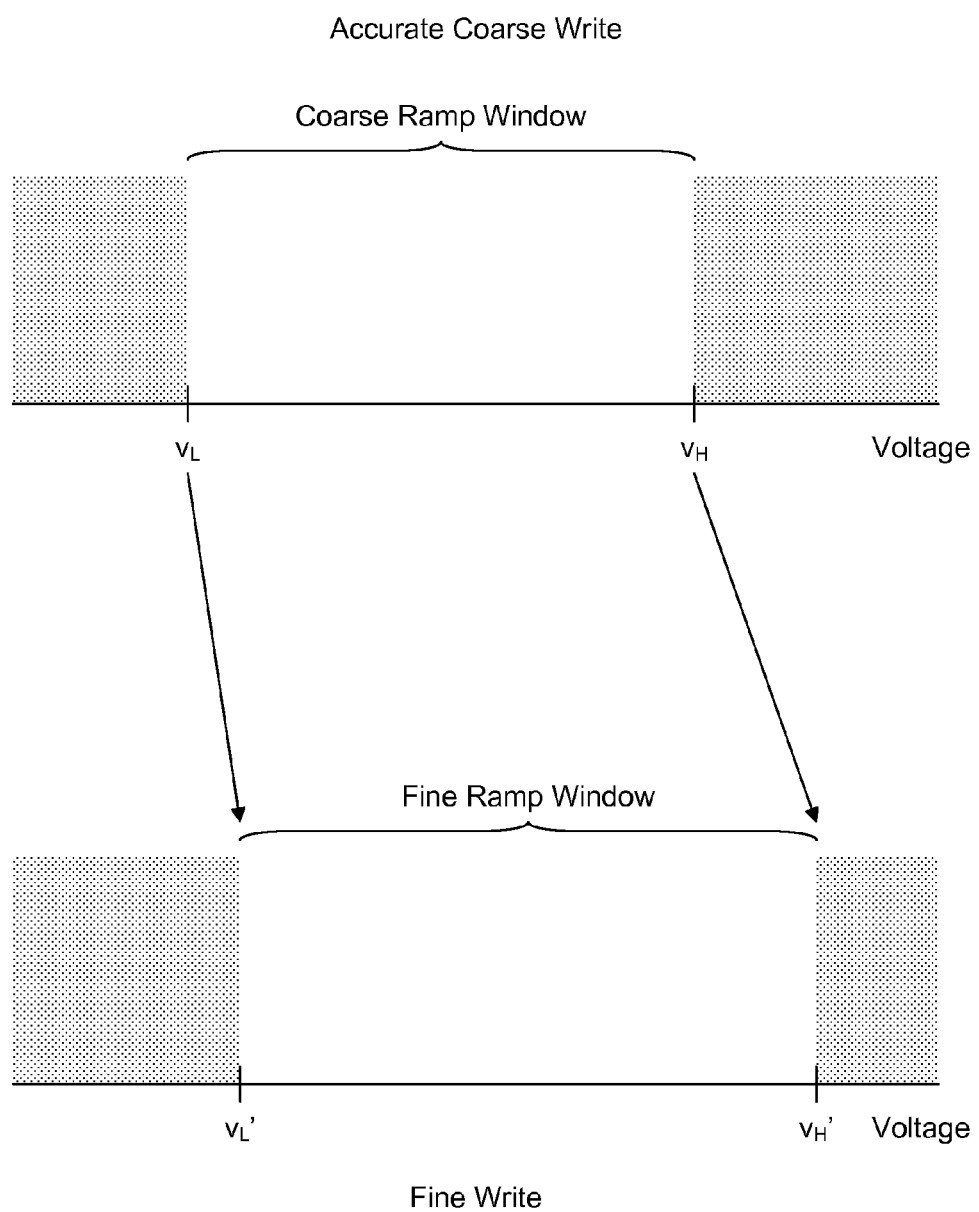
FIG. 5 is a diagram showing an embodiment of different ramp windows used for accurate coarse writes and fine writes.

FIG. 5 is a diagram showing an embodiment of different ramp windows used for accurate coarse writes and fine writes. In some embodiments, a ramp window is adjusted, for example so that a first ramp window is used for an accurate coarse write and a second ramp window is used for a fine write. A ramp window is the range of voltages which a Flash cell is permitted or otherwise configured to store. By adjusting the ramp window, different voltage floors and ceilings (i.e., $v_L$ and $v_H$) are able to be set. Voltages which are out of range or are not permitted for a particular ramp window are shown in the shaded portion. In this particular example, $v_L'$ is strictly greater than $v_L$ and $v_H'$ is strictly greater than $v_H$, but in some other embodiments ramp windows may be varied in other ways.

In some embodiments, a ramp window is adjusted to take advantage of Flash memory's different performance characteristics over different voltage ranges. For example, it may be easier to achieve a tighter distribution over a first voltage range as compared to a second voltage range. In some embodiments, using one ramp window for an accurate coarse write and another for a fine write seeks to exploit the different performance characteristics. In some embodiments, different ramp windows are used because it makes writing a correct value with an accurate coarse write easier and/or increases a degree to which this occurs.

Figure 6:
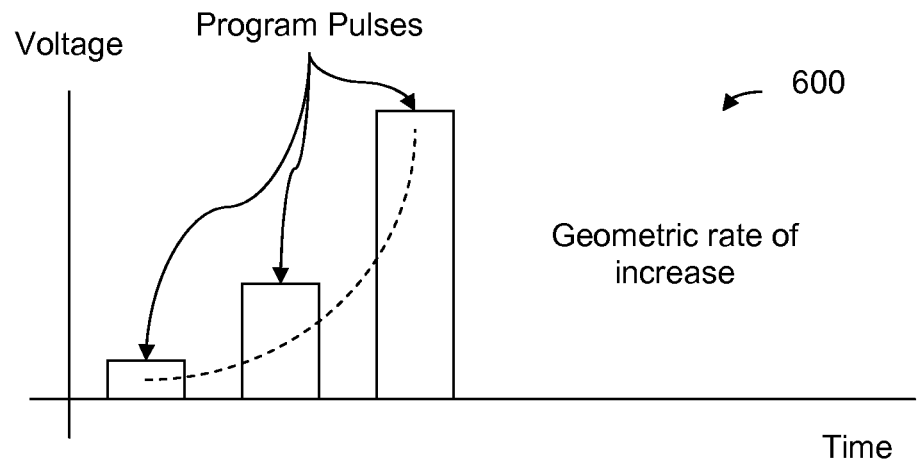
FIG. 6 is a diagram showing various embodiments of program pulses.
Figure 6:
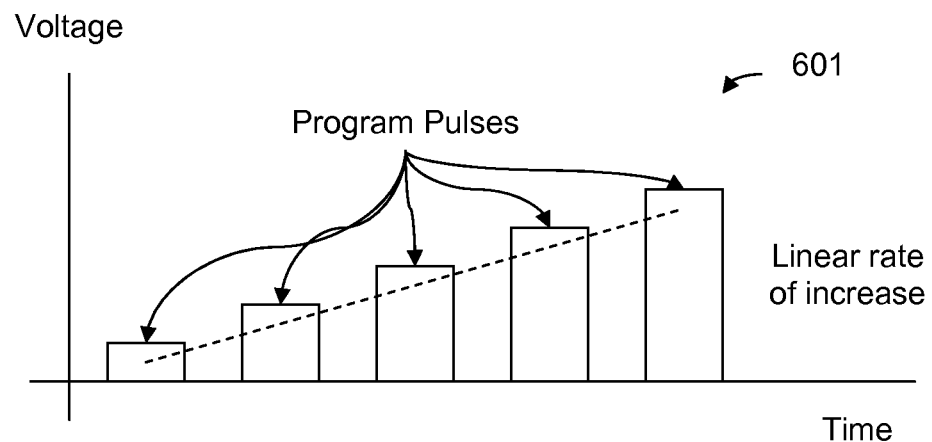
Figure 6:
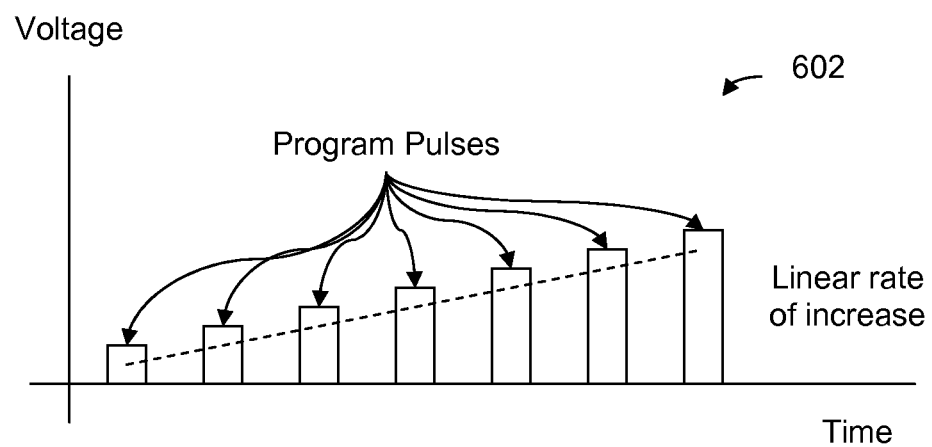

FIG. 6 is a diagram showing various embodiments of program pulses. In the example shown, diagrams 600-602 show various embodiments of program pulses. Program pulses are a series of one or more pulses of voltages that are sent to a Flash cell in order to program a particular voltage level. In other words, program pulses are used during a write operation to write a particular voltage level to Flash memory. Each voltage level in a cell may have a different set of program pulses; for clarity, the examples shown in diagrams 600-602 correspond to the same voltage level. For example, referring back to FIG. 3, the program pulses in this example may all correspond to programming the level L3 (i.e., above $v_{23}$) in diagram 300.

In some embodiments, a first set of program pulses is used during an accurate coarse write and a second set of program pulses is used for a fine write. For example, the program pulses shown in diagram 601 are used to program accurate coarse write in and the program pulses shown in diagram 602 are used to program level fine write. Program pulse increment steps and/or width can affect the quality of each programming and a flash controller may choose to use different program pulse settings to achieve a desirable result for an accurate coarse write and/or a fine write. As shown in this example, there are a variety of parameters or characteristics associated with program pulses that can be varied for an accurate coarse write and a fine write. For example, the step size increase in diagram 600 increases exponentially (i.e., the program pulses have voltages of a, ar, $ar^2$, $ar^3$, . . . ) and the step size increase in diagram 601 is a linear rate of increase (i.e., the program pulses have voltages of b, m+b, 2 m+b, 3 m+b, . . . ). Naturally, even though two sets of program pulses may both be linear (or exponential), different linear (or exponential) rates of increase may be employed. For example, the rate of increase (or, alternatively, step size) for the program pulses in diagram 602 is less than the rate of increase (or, alternatively, step size) for the program pulses shown in diagram 601. Another difference between the program pulses shown in diagram 600 and 601 is the number of program pulses (i.e., 3 program pulses in diagram 600 and 5 program pulses in diagram 601). In some embodiment, a duration of program pulses varies, as is shown in diagrams 601 and 602. The duration of the program pulses in diagram 602 is shorter in duration than those shown in diagram 601; in some embodiment the program pulses shown in diagram 601 are used during an accurate coarse write and the program pulses shown in diagram 602 are used in a fine write.

Figure 7:
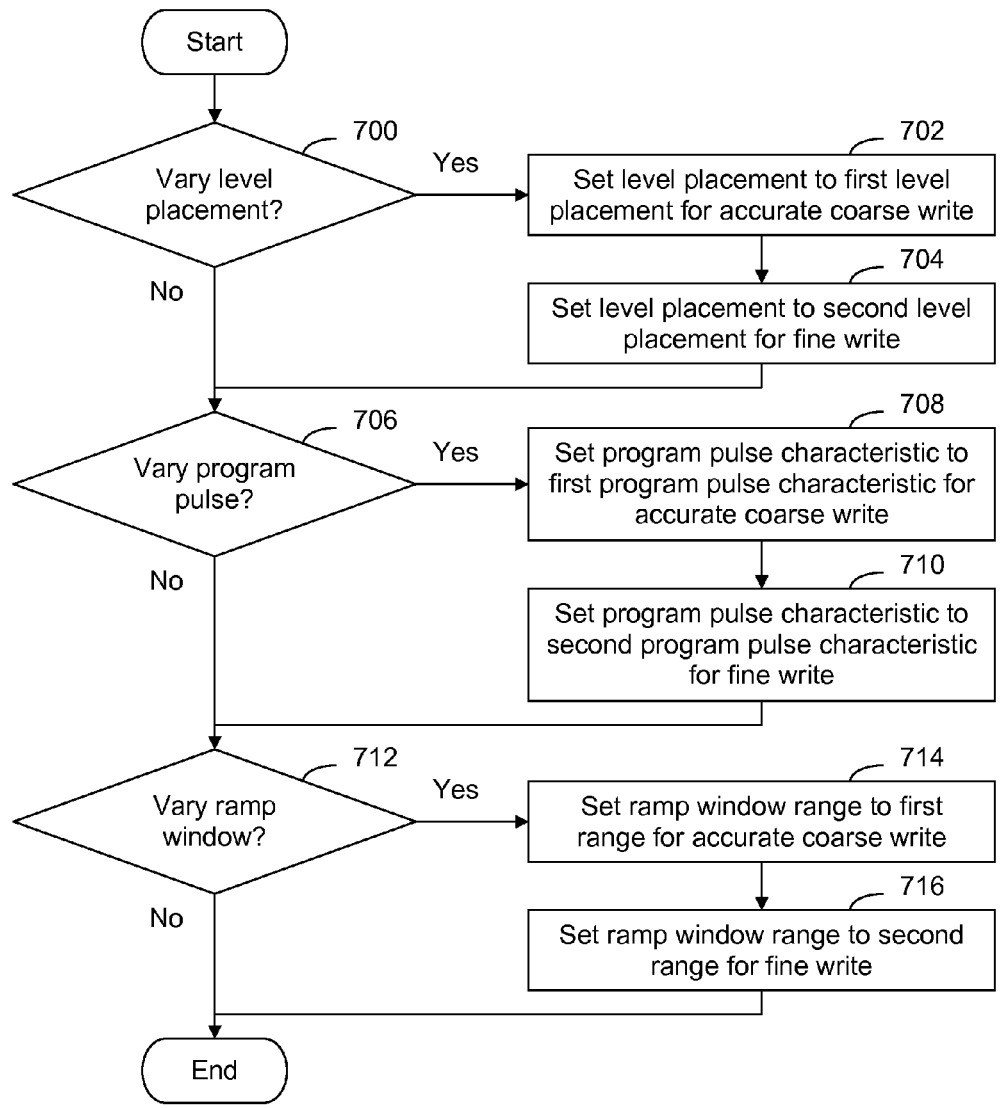
FIG. 7 is a flowchart illustrating an embodiment of a process for adjusting one or more configuration settings associated with Flash memory.

FIG. 7 is a flowchart illustrating an embodiment of a process for adjusting one or more configuration settings associated with Flash memory. Referring back to the example of FIG. 1, in some embodiments, the process is performed by Flash controller 150 on Flash memory 152.

At 700 it is determined whether a level placement is to be varied. This is the case, for example, in the embodiment shown in FIG. 4 where a first set of level placements is used for an accurate coarse write and a second set of level placements is used for a fine write. Various Flash memory manufacturers may expose different capabilities or controls and so if a level placement or other configuration setting is not to be exposed, then this decision or a corresponding decision is "No." In some embodiments, a system which performs an accurate coarse write is configurable and the decision at 700 (or some other decision in this process) is based at least in part on some configuration or setting (e.g., controlled by a user, firmware, or some other entity).

If it is determined at 700 that level placement is to be varied, a level placement is set to a first level placement for an accurate coarse write at 702 and at 704 the level placement is set to a second level placement for a fine write. In some embodiments, if there are back-to-back fine writes or back-to-back accurate coarse writes, then there is no need to change a configuration setting and so a Flash controller or other entity does not change a configuration setting.

After setting a level placement to be a second level placement at 704 or if it is determined at 700 that level placement is not to be varied, it is determined at 706 whether a program pulse is to be varied. As described above with respect to the decision at 700, the decision at 706 may be performed in a variety of ways.

If it is determined at 706 that a program pulse is to be varied, a program pulse characteristic is set to a first program pulse characteristic for an accurate coarse write at 708. At 710, the program pulse characteristic is set to a second program pulse characteristic for a fine write. In various embodiments, a program pulse characteristic set at 708 or 710 is associated with voltage, duration, step size, or a number of pulses. See, for example, FIG. 6 which shows some examples of program pulses.

If it is determined a program pulse is not to be varied at 706 or after setting a program pulse characteristic at 710, at 712 it is determined whether a ramp window is to be varied. In FIG. 5, for example, a first ramp window is used for accurate coarse writes and a second ramp window is used for fine writes. As described above, in some embodiments the decision at 712 depends upon a configuration (e.g., set by a user, driver, or other entity) and/or whether controls associated with a ramp window are exposed by a Flash memory.

If it is determined at 712 that a ramp window is to be varied, a ramp window range is set to a first range for an accurate coarse write at 714. At 716, the ramp window range is set to a second range for a fine write. In various embodiments, a voltage floor ($v_L$) and/or a voltage ceiling ($v_H$) is/are adjusted at 714 and 716. If it is determined that a ramp window is not to be varied or after setting a window range at 716, the process ends.

Figure 8:
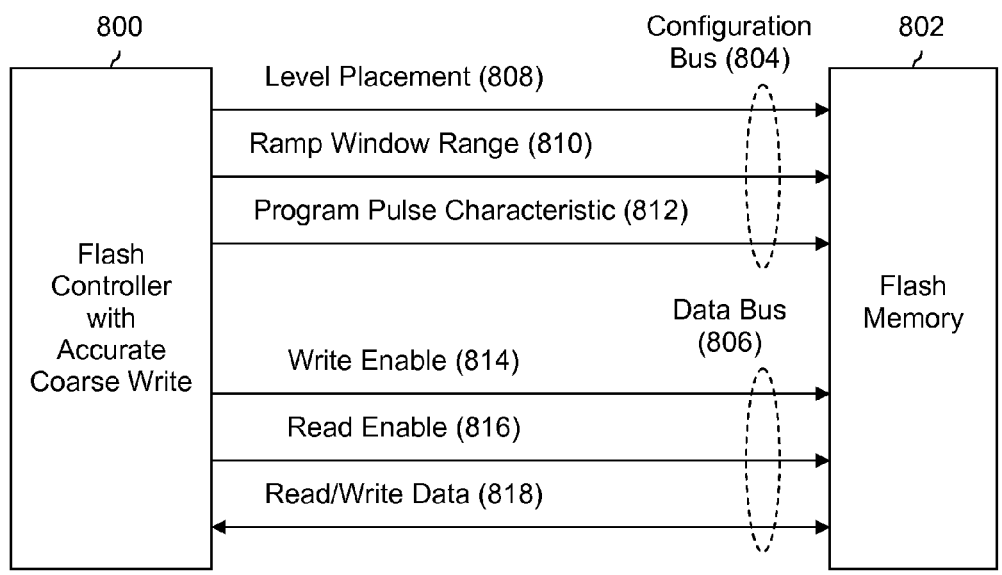
FIG. 8 is a diagram showing an embodiment of an interface between a Flash controller and a Flash memory used to change one or more configuration settings of a Flash memory during an accurate coarse write and a fine write.

FIG. 8 is a diagram showing an embodiment of an interface between a Flash controller and a Flash memory used to change one or more configuration settings of a Flash memory during an accurate coarse write and a fine write. In embodiments where a configuration setting is one value for an accurate coarse write and another value for a fine write, one or more signals in configuration bus 804 are used to change those configuration settings. In this particular example, configuration bus 804 includes level placement (808), ramp window range (810), and program pulse characteristic (812). Data bus 806 (which includes write enable 814, read enable 816, and read/write data 818) is used to perform read and write operations, including those related to an accurate coarse write and a fine write.

In one example of how Flash controller 800 adjusts configuration settings of Flash memory 802, prior to accurate coarse write 106 in FIG. 1, configuration bus 804 is used to set the level placement, ramp window range, and/or program pulse characteristic(s) to a value for an accurate coarse write. The configuration setting is not necessarily adjusted between accurate coarse writes 106 and 108 because (at least in this example) the configuration settings remain the same between those two writes. Between accurate coarse write 108 and fine write 110, the configuration settings which are being varied are changed to their fine write values. For example, if a ramp window is being varied, then the ramp window range is changed from a coarse ramp window range to a fine ramp window range.

In some embodiments, values for configuration settings are obtained by simulation or experimentation using real Flash memory. For example, a given Flash memory device may expose a certain set of configuration settings. Multiple simulations or experiments may be performed, for example sweeping the configuration settings to exhaustively test all combinations. In some embodiments, multiple writes and read backs are performed for each combination of possible values in order to obtain a set of voltage distributions (e.g., similar to those shown in FIGS. 3 and 4), each distribution of which corresponds to a particular combination of possible values for the exposed configuration settings.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for controlling a Flash memory, comprising:
   receiving, at a Flash controller, an instruction to write to a location in the Flash memory;
   determining, at the Flash controller, if the Flash memory exposes a level placement setting associated with defining what voltage range corresponds to what level; and in the event it is determined that the Flash memory exposes a level placement setting, in response to receiving the instruction:
   performing an accurate coarse write on the location, including by configuring the level placement setting to be a first value; and
   after the accurate coarse write is performed on the location, performing a fine write on the location, including by configuring the level placement setting to be a second value.

2. The method of claim 1, wherein the Flash memory exposes three level placement settings associated with defining four voltage ranges corresponding to four levels.

3. The method of claim 1, wherein the Flash controller includes a semiconductor device, including one or more of the following: an application-specific integrated circuit (ASIC), a field-programmable gate array (FPGA), an embedded microprocessor, or an Advanced RISC Machine (ARM) embedded core.

4. The method of claim 1 further comprising receiving, at the Flash controller, a second instruction to write to a second location in the Flash memory, wherein: after the accurate coarse write is performed on the location and before the fine write is performed on the location, an accurate coarse write is performed on the second location.

5. The method of claim 4, wherein the accurate coarse write is performed on the second location without changing the level placement setting from the first value.

6. The method of claim 1 further comprising:
   determining, at the Flash controller, if the Flash memory exposes a ramp window setting associated with a permitted voltage range; and
   in the event it is determined that the Flash memory exposes a ramp window setting:
      performing the accurate coarse write further includes configuring the ramp window setting to be a first ramp window value; and
      performing the fine write further includes configuring the ramp window setting to be a second ramp window value.

7. The method of claim 1 further comprising:
   determining, at the Flash controller, if the Flash memory exposes a program pulse setting associated with configuring one or more program pulses which are used to write to the Flash storage; and
   in the event it is determined that the Flash memory exposes a program pulse setting:
      performing the accurate coarse write further includes configuring the program pulse setting to be a first program pulse value; and
      performing the fine write further includes configuring the program pulse setting to be a second program pulse value.

8. A system for controlling a Flash memory, comprising:
   a Flash controller configured to:
      receive an instruction to write to a location in the Flash memory;
      determine if the Flash memory exposes a level placement setting associated with defining what voltage range corresponds to what level; and
      in the event it is determined that the Flash memory exposes a level placement setting, in response to receiving the instruction:
         perform an accurate coarse write on the location, including by configuring the level placement setting to be a first value; and
         after the accurate coarse write is performed on the location, perform a fine write on the location, including by configuring the level placement setting to be a second value; and
   the Flash memory.

9. The system of claim 8, wherein the Flash memory exposes three level placement settings associated with defining four voltage ranges corresponding to four levels.

10. The system of claim 8, wherein the Flash controller includes a semiconductor device, including one or more of the following: an application-specific integrated circuit (ASIC), a field-programmable gate array (FPGA), an embedded microprocessor, or an Advanced RISC Machine (ARM) embedded core.

11. The system of claim 8, wherein:
   the Flash controller is further configured to receive a second instruction to write to a second location in the Flash memory; and
   after the accurate coarse write is performed on the location and before the fine write is performed on the location, an accurate coarse write is performed on the second location.

12. The system of claim 11, wherein the accurate coarse write is performed on the second location without changing the level placement setting from the first value.

13. The system of claim 8, wherein the Flash controller is further configured to:
   determine if the Flash memory exposes a ramp window setting associated with a permitted voltage range; and
   in the event it is determined that the Flash memory exposes a ramp window setting:
      performing the accurate coarse write further includes configuring the ramp is window setting to be a first ramp window value; and
      performing the fine write further includes configuring the ramp window setting to be a second ramp window value.

14. The system of claim 8, wherein the Flash controller is further configured to:
   determine if the Flash memory exposes a program pulse setting associated with configuring one or more program pulses which are used to write to the Flash storage; and
   in the event it is determined that the Flash memory exposes a program pulse setting:
      performing the accurate coarse write further includes configuring the program pulse setting to be a first program pulse value; and
      performing the fine write further includes configuring the program pulse setting to be a second program pulse value.

15. A computer program product for controlling a Flash memory, the computer program product being embodied in a non-transitory computer readable storage medium and comprising computer instructions for:
   receiving an instruction to write to a location in the Flash memory;
   determining if the Flash memory exposes a level placement setting associated with defining what voltage range corresponds to what level; and
   in the event it is determined that the Flash memory exposes a level placement setting, in response to receiving the instruction:
      performing an accurate coarse write on the location, including by configuring the level placement setting to be a first value; and after the accurate coarse write is performed on the location, performing a fine write on the location, including by configuring the level placement setting to be a second value.

16. The computer program product of claim 15, wherein the Flash memory exposes three level placement settings associated with defining four voltage ranges corresponding to four levels.

17. The computer program product of claim 15 further comprising computer instructions for receiving, at the Flash controller, a second instruction to write to a second location in the Flash is memory, wherein: after the accurate coarse write is performed on the location and before the fine write is performed on the location, an accurate coarse write is performed on the second location.

18. The computer program product of claim 17, wherein the accurate coarse write is performed on the second location without changing the level placement setting from the first value.

19. The computer program product of claim 15 further comprising computer instructions for:
  determining if the Flash memory exposes a ramp window setting associated with a permitted voltage range; and
  in the event it is determined that the Flash memory exposes a ramp window setting:
    performing the accurate coarse write further includes configuring the ramp window setting to be a first ramp window value; and
    performing the fine write further includes configuring the ramp window setting to be a second ramp window value.

20. The computer program product of claim 15 further comprising computer instructions for:
  determining if the Flash memory exposes a program pulse setting associated with configuring one or more program pulses which are used to write to the Flash storage; and
  in the event it is determined that the Flash memory exposes a program pulse setting:
    performing the accurate coarse write further includes configuring the program pulse setting to be a first program pulse value; and
    performing the fine write further includes configuring the program pulse setting to be a second program pulse value.

* * * * *